United States Patent

Nawate

[11] Patent Number: 6,093,445
[45] Date of Patent: Jul. 25, 2000

[54] MICROSCOPIC ELEMENT MANUFACTURING METHOD AND EQUIPMENT FOR CARRYING OUT THE SAME

[75] Inventor: Masahiko Nawate, Matsue, Japan

[73] Assignee: Shimane University, Matsue, Japan

[21] Appl. No.: 09/315,140

[22] Filed: May 20, 1999

[30] Foreign Application Priority Data

Aug. 12, 1998 [JP] Japan .................................. 10-227926

[51] Int. Cl.[7] ...................................................... B05D 5/12
[52] U.S. Cl. ......................... 427/128; 118/282; 118/301; 118/500; 118/504; 118/715; 118/718; 118/720; 118/723 EB; 204/192.34; 216/66; 427/255.5; 427/289; 427/585; 427/595
[58] Field of Search .................................. 427/128, 255.5, 427/289, 585, 595; 216/66; 204/192.34; 118/282, 301, 500, 504, 715, 718, 720, 723 EB

[56] References Cited

FOREIGN PATENT DOCUMENTS

| | | |
|---|---|---|
| 61-131462 | 6/1986 | Japan . |
| 368755 | 3/1991 | Japan . |
| 470279 | 6/1992 | Japan . |
| 745430 | 2/1995 | Japan . |

*Primary Examiner*—Bernard Pianalto
*Attorney, Agent, or Firm*—Stevens, Davis, Miller & Mosher, L.L.P.

[57] ABSTRACT

A mask with a microscopic pin-hole having a circular configuration with a diameter of 1 nm to 10 $\mu$m or a rectangular configuration with a side of 1 nm to 10 $\mu$m is arranged opposite to a substrate. A magnetic material composing a magnetic microdevice is deposited on the substrate through the pin-hole of the mask to form the magnetic microdevice having fine structure on the substrate. By moving the substrate and mask relative to each other in an X-Y plane parallel with the surface of the substrate in a stepwise manner, a plurality of microelements may be formed on the substrate in a matrix form. By moving the substrate and mask relative to each other during the deposition, an elongated microelement may be formed. The rectangular pin-hole of the mask is formed by stacking grid-meshes for use in an electron microscope such that rectangular openings formed in the gridmeshes are aligned in a diagonal direction. The mask may be formed by a diaphragm for use in a transmission electron microscope. The circular pin-hole may be formed by projecting a focussed ion-beam upon a metal foil.

18 Claims, 3 Drawing Sheets

MICROSCOPIC ELEMENT MANUFACTURING METHOD AND EQUIPMENT FOR CARRYING OUT THE SAME

BACKGROUND OF THE INVENTION

Field of the Invention

This invention relates to a method of manufacturing microscopic elements or microelements and an apparatus for carrying out the same. More particularly, this invention is directed to a method of manufacturing magnetic microelements such as magnetic microdevices and magnetic quantum devices, and an apparatus for manufacturing such magnetic microelements.

A technique of manufacturing microelements has been developed particularly in the field of semiconductor. In a typical known method of manufacturing microelements, after forming a thin film of about 0.1–2 µm thickness on a substrate by evaporation or CVD method, a part of the thin film is removed by electron-beam lithography, photolithography or electron-beam drawing method to form a microelement having a desired configuration or pattern.

On the other hand, since the concept about the magnetic integrated circuit has been proposed in the field of magnetic materials, various types of research have been carried out in an attempt to improve a resolving power of magnetic structures by means of ultramicro fabrication technique. To this end, in addition to the above mentioned electron-beam drawing method, micro-lithography, a lift-off method, argon-ion-milling and the like have been adopted in the ultramicro fabrications of magnetic elements.

The electron-beam drawing method requires not only complex and expensive equipment such as a plasma CVD equipment, electron-beam lithography equipment, and focused ion-beam equipment, but also large scale equipment such as a clean room, mask aligner and the like.

In the micro-lithography, a microscopic pattern, i.e. micropattern or nano-pattern is directly formed in a resist film applied on a surface of a material to be processed, and therefore such a process could not be practically applied in mass production on a commercial base.

Also in the lift-off method, a process could not be performed in a depth direction, and thus it could not be applied to the manufacture of magnetic microelements such as a thin film magnetic head, micro-inductor and magnetic microdevice which require a relatively large thickness.

Since the argon ion-milling does not utilize a chemical reaction, its processing speed could not be higher than a difference between a milling rate for a mask material and a milling rate for a material to be processed. Furthermore, a cross sectional configuration of a processed material is liable to be trapezoid, so that the formation of microelements is restricted.

SUMMARY OF THE INVENTION

It is an object of this invention to provide a novel and useful method of manufacturing a microelement and an equipment for carrying out the same, in which the above mentioned problems of the prior art can be removed or at least mitigated.

According to the invention, a method of manufacturing a microelement comprises the steps of:

arranging a mask opposite to a substrate, said mask having a pin-hole having a circle shape of a diameter of 1 nm–10 µm or a rectangular shape of a side of 1 nm–10 µm; and depositing a material composing the microelement on the substrate through said pin-hole of the mask.

According to the invention, an equipment for manufacturing a microelement on a substrate comprises:

a substrate supporting means for supporting a substrate;

a mask supporting means for supporting a mask with a pin hole having a circular shape of a diameter of 1 nm to 10 µm or a rectangular shape having a side of 1 nm to 10 µm, said mask supporting means supporting the mask such that the mask is directly opposite to a surface of the substrate;

an actuating means for moving said substrate and mask relative to each other in an X-Y plane parallel to the surface of the substrate in a stepwise fashion; and a deposition source for depositing a material composing a microelement on the surface of the substrate through said pin-hole of the mask.

According to the invention, said actuating means may be constructed by a driving device for moving the substrate supporting means or a driving device for moving the mask supporting means or a driving device for moving both the substrate supporting means and mask supporting means.

In the conventional method such as the electron-beam drawing method, a thin film of a material composing a microelement is first formed on a substrate and thereafter a part of the thin film is removed to form the microelement. In microelement manufacturing method according to the invention, a mask with a pin-hole of a circle shape having a diameter of 1 nm to 10 µm or a pin-hole of a rectangular shape having a side of 1 nm to 10 µm is arranged opposite to a substrate and a material composing an microelement is deposited on the substrate through the mask to form directly the microelement thereon.

It have been considered that the micro pin-hole having the above mentioned shape and size could not be formed practically. The inventor of the present application has succeeded to form such micro pin-hole precisely by a method to be explained later and has arrived at the present invention.

In the method according to the invention, any complicated and expensive equipment such as electron-beam lithography equipment is not required and a microelement having a diameter or a side of about 10 nm to 2 µm can be formed with a rather simple equipment. Moreover, by adjusting the deposition time, it is possible control a thickness of the microelement in a precise manner, and therefore a microscopic device having a relatively large thickness can be easily and precisely formed. Although the present invention is not limited to the formation of magnetic microelements such as magnetic microdevices and magnetic quantum devices, the present invention is particularly preferable to be applied to magnetic elements having microscopic structure.

DESCRIPTION OF THE PREFERRED EMBODIMENTS

Figure 1:
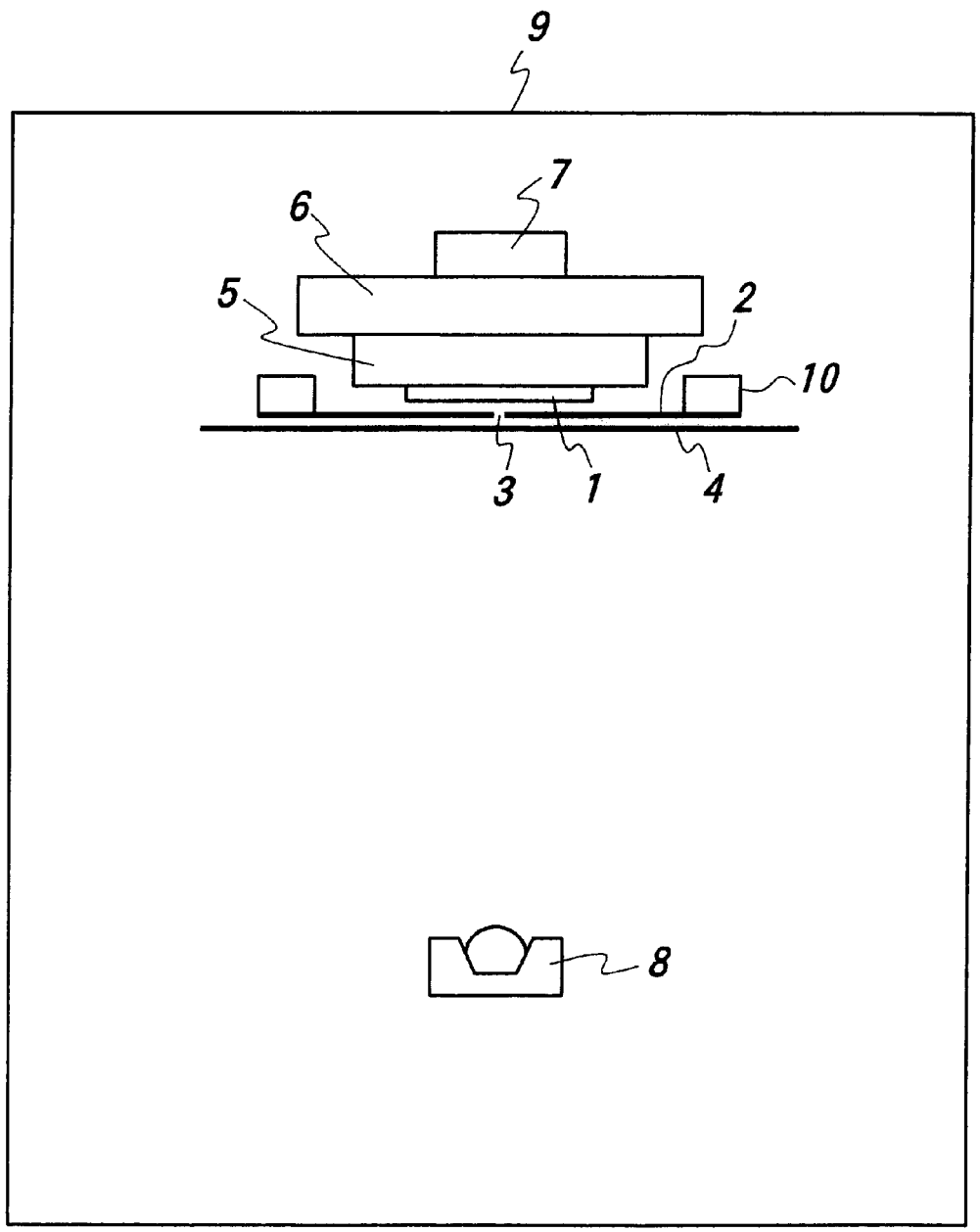
FIG. 1 is a schematic diagram showing a preferred embodiment of the microelement manufacturing equipment according to the invention.

FIG. 1 is a schematic diagram showing an embodiment of the equipment for manufacturing a microelement according to the invention.

In FIG. 1, a substrate 1 made of silicon is secured to a substrate holder 5 by means of a suitable adhesive or screws. The substrate holder 5 is fixed to an X-Y actuator 6 for moving the substrate holder in an X-Y plane which is parallel with the plane of the substrate 1. The X-Y actuator 6 is then secured to a Z actuator 7 for moving the X-Y actuator 6 and thus the substrate 1 in a Z direction perpendicular to the X-Y plane. A mask 2 with a fine pin-hole 3 is supported by a mask holder 10 such that the mask is arranged opposite to the substrate 1 in parallel with each other. Under the mask 2, there is arranged a shutter 4, and further an evaporation source 8 is arranged underneath the shutter. The all the above explained members are installed within a vacuum chamber 9.

According to the invention, the pin-hole 3 formed in the mask 2 should have a circular shape with a diameter of 1 nm–10 $\mu$m, preferably 1 nm–1 $\mu$m, and more preferably 1 nm–100 nm. Further, when the pin-hole 3 is formed as a rectangular opening, its side length should be 1 nm–10 $\mu$m, preferably 1 nm–1 $\mu$m, and more preferably 1 nm–100 nm. If the pin-hole 3 is larger than the above mentioned size range, the object of this invention could not be attained. According to the invention, it is possible to form a substantially circular or rectangular microelement having a diameter or a side of 10 nm–2 $\mu$m.

The pin-hole 3 in the mask 2 may be formed by various methods. For instance, plural masks having openings, e.g. grid-meshes having circular or rectangular openings of a size of 20–30 $\mu$m for the electron microscope may be stacked one another such that a pin-hole having a desired size is formed by these openings. Furthermore, an aperture for selected area observation in the transmission electron microscope may be used as the mask in the method according to the invention. Moreover, the mask may be constructed by forming a pin-hole in a Ta foil by means of a focussed ion-beam.

Figure 2:
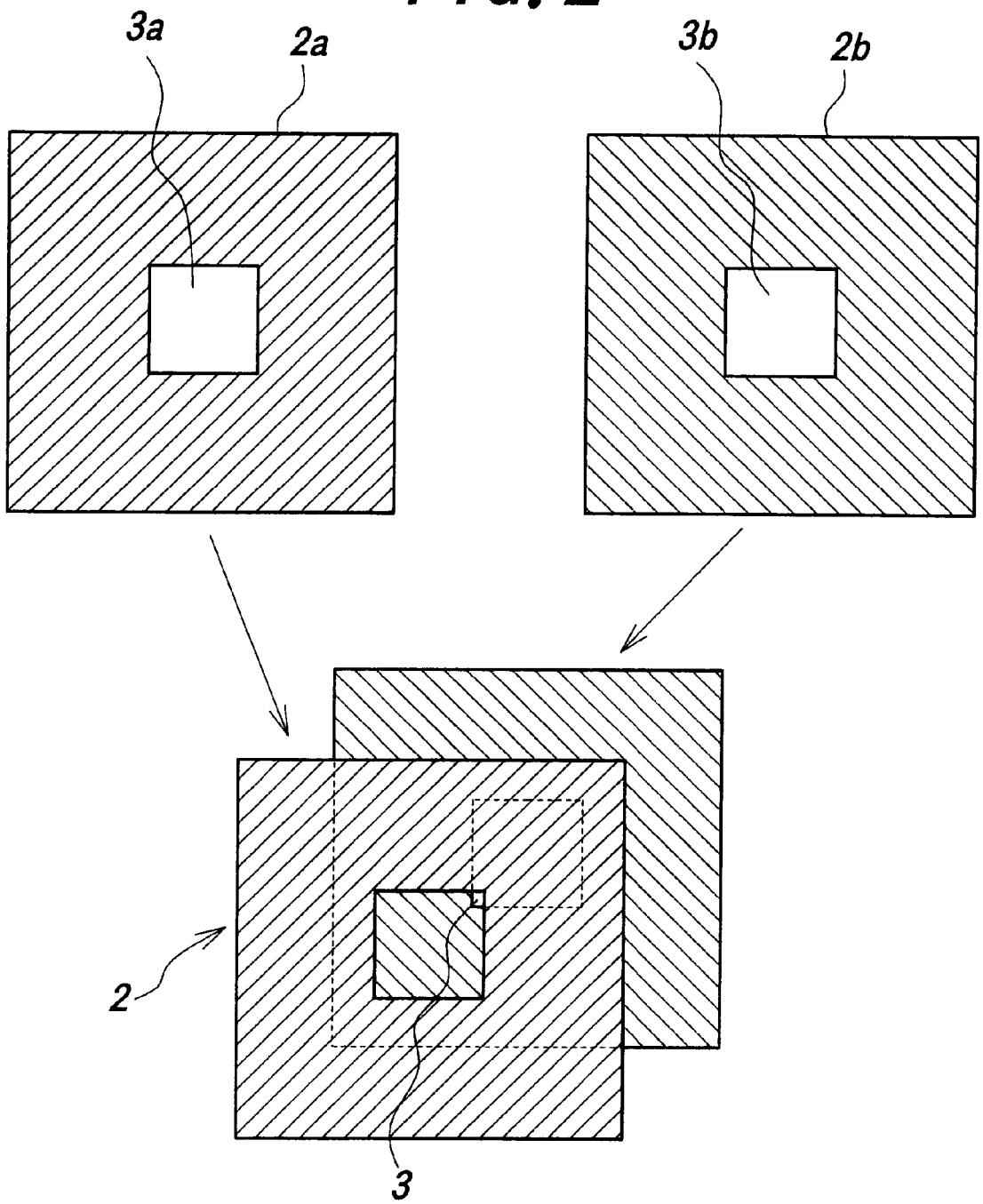
FIG. 2 is a schematic diagram showing an example of the method of forming a pin-hole in a mask to be used in the method according to the invention.

FIG. 2 shows an embodiment of the mask with the pin-hole according to the invention. In this embodiment, a rectangular pin-hole 3 is formed by stacking two grid-meshes 2a and 2b for use in the electron microscope, each of said grid-meshes having large rectangular openings 3a and 3b. That is to say, the two grid-meshes 2a and 2b are arranged such that the rectangular openings 3a and 3b are aligned in the diagonal direction such that the rectangular pin-hole 3 is formed by these openings.

Figure 3:
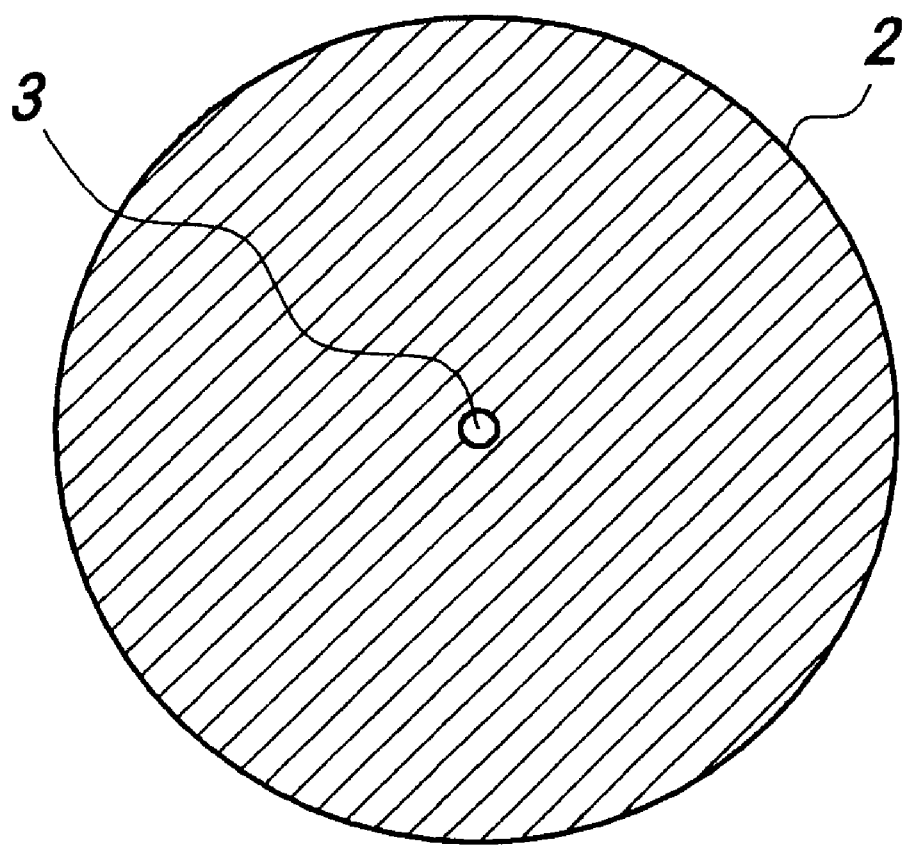
FIG. 3 is a schematic diagram showing another example of the method of forming a pin-hole in a mask to be used in the method according to the invention.

FIG. 3 shows another embodiment of the mask 2 with the pin-hole like circle 3. The mask 3 is formed by a Ta foil and the circular pin-hole 3 is formed by irradiating a focussed ion-beam upon the Ta foil. Since the focussed ion-beam generally has a circular cross section, it is possible to form the circular pin-hole 3 by means of the focussed ion-beam as shown in FIG. 3.

It should be noted that the mask 2 may be made of any suitable material such as Ta, Cu, Fe, Si and W.

The X-Y actuator 6 and Z actuator 7 may be constructed by any suitable actuators such as stepping motors and piezo-electric actuator. It is preferable to construct the actuators 6 and 7 by means of both a mechanical actuating device and a piezo-electric actuating device. That is to say, the mechanical actuating device is used for a rough movement and the piezo-electric actuating device is used for a fine movement. Then, a plurality of microelements can be precisely made within a short time period, and the ability of production can be improved.

The mechanical actuating device may be a stepping motor, or a combination of a stepping motor and gears. The piezo-electric actuating device may be a well-known piezo-electric actuator such as the inchworm motor (trade name) and digital piezo translator (trade name).

Now successive steps of the method according to the invention will be explained.

After installing the substrate 1 and mask 2 at given positions and a material to be evaporated is placed in the evaporation source 8, the vacuum chamber 9 is evacuated to a pressure below $1 \times 10^{-6}$ Torr with a pump (not shown). Subsequently, the substrate 1 is heated up to a desired temperature, and the evaporation source 8 is heated to generate a vapor of the material to be deposited. After it is confirmed that the evaporation rate from the evaporation source 8 becomes constant with the aid of a film thickness monitor provided in the vacuum chamber 9, the shutter 4 is opened, the material evaporated from the evaporation source 8 is deposited on the substrate 1 through the pin-hole 3 of the mask 2 until a microelement having a desired thickness is formed on the substrate 1. After that, the shutter 4 is closed to stop the deposition of the material on the substrate 1. It should be noted that a pattern of the microelement formed on the substrate 1 is determined by a shape of the pin-hole 3 in the mask 2 and a thickness of the microelement is determined by the deposition time period and a deposition rate. In this case, it is preferable that the mask 2 is brought into contact with the surface of the substrate 1 from the view point of a fine structure of the microelement.

In case of using a mask 2 with a circular pin-hole having a diameter of 1 nm–10 $\mu$m, it is possible to form a circular microelement having a diameter of 10 nm–2 $\mu$m and a thickness of 1 nm–10 $\mu$m. Alternatively, when a mask 2 having a rectangular pin-hole having a side of 10 nm–2 $\mu$m, it is possible to form a rectangular microelement having a side of 1 nm–10 $\mu$m.

When a plurality of microelements are to be formed, after forming one microelement in the manner explained above, the substrate 1 is lifted upward by a small distance by means of the Z actuator 7 so that the substrate is separated from the mask 2. Then, the X-Y actuator 6 is driven and the substrate holder 5 and substrate 1 are moved in the X direction over a predetermined distance and is stopped thereat. At this position, the above mentioned deposition process is carried out to form a second microelement on a side of the previously formed element. By repeating the above processes in a stepwise manner, while the substrate 1 is moved in the X-Y fashion, a plurality of microelements can be formed in a matrix form. In this case, the substrate 1 is preferably moved with a step of 0.1–50 nm and more preferably with a step of 0.1–10 nm.

According to the invention, when the substrate holder 5 and thus the substrate 1 is continuously moved by the X-Y actuator 6 in one direction during the evaporation process, an elongated microelement having a very small width such as 10 nm–2 $\mu$m and a length of several millimeters length also can be formed.

In FIG. 1, the mask 2 has the single pin-hole 3 formed therein, but a mask with plural pin-holes may be used in the method according to the invention. By using such a mask with plural pin-holes, it is possible to form a plurality of microelements on the substrate at the same time, whereby the productivity of the micro element can be improved.

In the case of forming plural pin-holes in a single mask, these pin-holes may be different in shape and size, and it is also possible to use a mask having a plurality of pin-holes having different shapes and sizes. By using such a mask, it is possible to form on the substrate a plurality of microelements having different shapes and sizes.

In the present embodiment, the micro element is formed by evaporation, it is also possible to form the microelement by sputtering, CVD, MBE, laser abrasion, and the like.

According to the present invention, a microelement may be made of any material, but the method according to the invention is particularly preferable for forming a magnetic microdevice made of a magnetic element such as Fe, Co, Ni, rare metal and a metal or compound including one or more of such metals.

EXAMPLE

Now an example of the method according to the present invention will be described.

By using the equipment shown in FIG. 1, a magnetic microdevice made of Co was fabricated on a substrate 1 formed by a slide glass. A rectangular pin-hole 3 with a side of 1.3 $\mu$m of the mask 2 was constructed by stacking two grid-meshes for use in the electron microscope, each of said grid-meshes having a rectangular opening with a side of 30 $\mu$m.

After a vacuum chamber 9 was evacuated to a pressure $1 \times 10^{-6}$ Torr, Co pellets placed within a hearth made of Cu were heated and evaporated with the aid of an electron beam by applying 2 kV voltage to an electron beam equipment constituting the evaporation source 8.

The evaporation rate was monitored with a film thickness monitor (not shown) installed within the vacuum chamber 9 during the deposition. When the evaporation rate became to be 6 nm/min, a shutter 4 was opened to deposit Co on the substrate 1 through the pin-hole 3 of the mask 2 until the monitor indicated a deposition thickness of 100 nm.

The thus obtained magnetic microdevice was monitored by means of an atomic force microscope, and it was confirmed that the rectangular magnetic microdevice having a side of 1.3 $\mu$m and a thickness or height of 100 nm was formed.

As explained above in detail, in the microelement manufacturing method and equipment according to the invention, a mask with a circular or rectangular micro pin-hole having a diameter or a side of 1 nm–10 $\mu$m is arranged opposite to a substrate, and a material composing the microelement is deposited on the substrate through the pin-hole of the mask to form the microelement on the substrate.

Accordingly the microelement can be formed precisely and easily in a less expensive manner, and a thickness of the microelement can be controlled by adjusting the deposition time and the deposition rate. Therefore, a thickness of the microelement can be sufficiently large. Furthermore, the present invention can be advantageously applied to the formation a magnetic microdevice such as a thin film magnetic head.

What is claimed is:

1. A method of manufacturing a microelement comprising the steps of:

(a) arranging a mask opposite to a substrate, said mask having at least one pin-hole having one of a circular shape of a diameter of 1 nm–10 $\mu$m and a rectangular shape of a side of 1 nm–10 $\mu$m; and (b) depositing a material composing the microelement on the substrate through said pin-hole of the mask.

2. A method of manufacturing a microelement as claimed in claim 1, wherein said rectangular pin-hole of the mask is formed by stacking a plurality of masks opposite to the substrate, each mask having a rectangular opening larger than said rectangular pin-hole such that said rectangular pin-hole is formed by an intersection of at least a portion of each said rectangular openings in said plurality of masks.

3. A method of manufacturing a microelement as claimed in claim 1, wherein the mask with the pin-hole is formed by an aperture for selected area observation in a transmission electron microscope.

4. A method of manufacturing a microelement as claimed in claim 1, wherein said mask with the circular pin-hole is formed by projecting a focussed ion-beam upon a metal foil.

5. A method of manufacturing a microelement as claimed in claim 1, further comprising the step of (c) moving the substrate and mask relative to each other in a direction parallel to the mask or substrate with a pitch of 0.1–50 nm; and (d) repeating steps (a) through (c) to form successively a plurality of microelements in a stepwise manner.

6. A method of manufacturing a microelement as claimed in claim 1, further comprising the step of (c) continuously moving the substrate and mask relative to each other during the deposition of the material to form an elongated microelement on the substrate.

7. A method of manufacturing a microelement as claimed in claim 1, wherein said microelement is formed to have a circular shape with a diameter of 10 nm–2 $\mu$m or a rectangular with a side of 10 nm–2 $\mu$m.

8. A method of manufacturing a microelement as claimed in claim 1, in which a magnetic material is deposited on the substrate through the pin-hole of the mask to form a magnetic microdevice.

9. An equipment for manufacturing a microelement on a substrate comprising:

a substrate supporting means for supporting a substrate;

a mask supporting means for supporting a mask with a pin hole having one of a circular shape of a diameter of 1 nm to 10 $\mu$m and a rectangular shape having a side of 1 nm to 10 $\mu$m, said mask supporting means supporting the mask such that the mask is directly opposite to a surface of the substrate;

an actuating means for moving said substrate and mask relative to each other in an X-Y plane parallel to the surface of the substrate in a stepwise fashion; and a deposition source for depositing a material composing a microelement such that the material is deposited on the surface of the substrate through said pin-hole of the mask.

10. An equipment for manufacturing a microelement as claimed in claim 9, wherein said actuating means is constructed by a driving device for moving the substrate supporting means in the X-Y plane.

11. An equipment for manufacturing a microelement as claimed in claim 9, wherein said actuating means is constructed by a driving device for moving the substrate supporting means in the X-Y plane.

12. An equipment for manufacturing a microelement as claimed in claim 9, wherein said actuating means is constructed by a driving device for moving the mask supporting means in the X-Y plane.

13. An equipment for manufacturing a microelement as claimed in claim 9, wherein said actuating means is constructed by a driving device for moving the substrate supporting means as well as the mask supporting means in the X-Y plane.

14. An equipment for manufacturing a microelement as claimed in claim 9, wherein said actuating means includes a Z actuator for moving the substrate supporting means in a Z direction perpendicular to the X-Y plane.

15. An equipment for manufacturing a microelement as claimed in claim 9, wherein said actuating means includes a mechanical actuator for performing a rough movement and a piezo-electric actuator for carrying out a fine movement.

16. An equipment for manufacturing a microelement as claimed in claim 9, wherein said deposition source is formed by an evaporation source for evaporating said material.

17. An equipment for manufacturing a microelement as claimed in claim 16, wherein said evaporation source is formed by an electron beam device.

18. An equipment for manufacturing a microelement as claimed in claim 9, further comprising a shutter arranged between the deposition source and the mask.

\* \* \* \* \*